United States Patent
Loechelt et al.

(10) Patent No.: US 9,818,831 B2
(45) Date of Patent: Nov. 14, 2017

(54) DMOS TRANSISTOR INCLUDING A GATE DIELECTRIC HAVING A NON-UNIFORM THICKNESS

(71) Applicant: SEMICONDUCTOR COMPONENTS INDUSTRIES, LLC, Phoenix, AZ (US)

(72) Inventors: Gary H. Loechelt, Tempe, AZ (US); Gordon M. Grivna, Mesa, AZ (US)

(73) Assignee: SEMICONDUCTOR COMPONENTS INDUSTREIS, LLC, Phoenix, AZ (US)

( * ) Notice: Subject to any disclaimer, the term of this patent is extended or adjusted under 35 U.S.C. 154(b) by 217 days.

(21) Appl. No.: 13/794,137

(22) Filed: Mar. 11, 2013

(65) Prior Publication Data

US 2014/0252430 A1   Sep. 11, 2014

(51) Int. Cl.
*H01L 29/66* (2006.01)
*H01L 29/78* (2006.01)
*H01L 29/40* (2006.01)
*H01L 21/28* (2006.01)
*H01L 29/423* (2006.01)
(Continued)

(52) U.S. Cl.
CPC .. *H01L 29/42368* (2013.01); *H01L 29/66689* (2013.01); *H01L 29/66696* (2013.01); *H01L 29/7816* (2013.01); *H01L 21/2815* (2013.01); *H01L 29/0653* (2013.01); *H01L 29/1095* (2013.01); *H01L 29/401* (2013.01); *H01L 29/402* (2013.01); *H01L 29/4175* (2013.01); *H01L 29/41766* (2013.01); *H01L 29/42376* (2013.01)

(58) Field of Classification Search
CPC ......... H01L 29/42376; H01L 29/41766; H01L 29/0847; H01L 29/78; H01L 29/66689; H01L 29/66696; H01L 29/7816; H01L 29/402; H01L 21/2815
USPC .......................... 257/368; 438/337, 339, 197
See application file for complete search history.

(56) References Cited

U.S. PATENT DOCUMENTS 6,593,621 B2   7/2003   Tsuchiko et al.
7,276,747 B2   10/2007   Loechelt et al.
(Continued)

OTHER PUBLICATIONS

Sharma S. et al., "Planar Dual Gate Oxide LDMOS Structures in 180nm Power Management Technology," Proceedings of the 2012 24th International Symposium on Power Semiconductor Devices and ICs, Jun. 2012, pp. 405-408.

*Primary Examiner* — Marcos D Pizarro
(74) *Attorney, Agent, or Firm* — Abel Law Group, LLP

(57) ABSTRACT

An electronic device can include a transistor having a drain region, a source region, a dielectric layer, and a gate electrode. The dielectric layer can have a first portion and a second portion, wherein the first portion is relatively thicker and closer to the drain region; the second portion is relatively thinner and closer to the source region. The gate electrode of the transistor can overlie the first and second portions of the dielectric layer. In another aspect, an electronic device can be formed using two different dielectric layers having different thicknesses. A gate electrode within the electronic device can be formed over portions of the two different dielectric layers. The process can eliminate masking and doping steps that may be otherwise used to keep the drain dopant concentration closer to the concentration as originally formed.

13 Claims, 14 Drawing Sheets

(51) Int. Cl.
    *H01L 29/06*     (2006.01)
    *H01L 29/10*     (2006.01)
    *H01L 29/417*     (2006.01)

(56) References Cited

U.S. PATENT DOCUMENTS

| | | |
|---|---|---|
| 7,745,846 B2 | 6/2010 | Korec et al. |
| 7,989,857 B2 | 8/2011 | Loechelt |
| 8,298,886 B2 | 10/2012 | Loechelt et al. |
| 2004/0031981 A1* | 2/2004 | Grivna .......................... 257/302 |
| 2005/0045946 A1* | 3/2005 | Kobayashi .......... H01L 29/7835 257/335 |
| 2006/0180947 A1* | 8/2006 | Loechelt et al. .............. 257/900 |
| 2007/0262369 A1* | 11/2007 | Lin et al. ....................... 257/315 |
| 2009/0146186 A1 | 6/2009 | Kub et al. |

\* cited by examiner

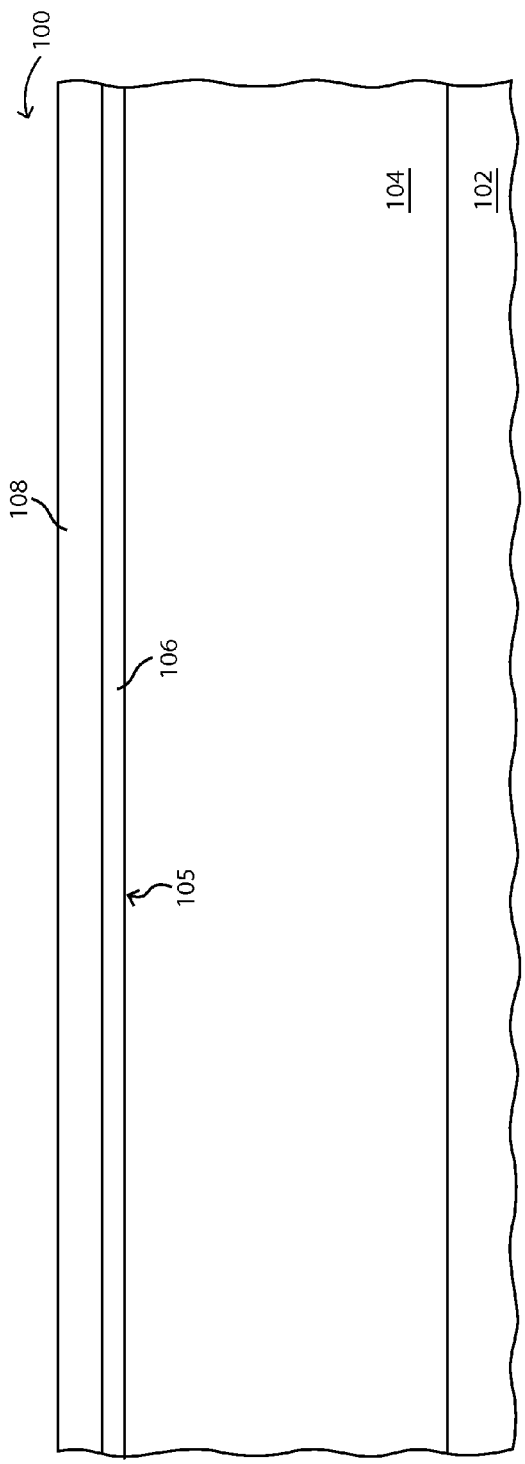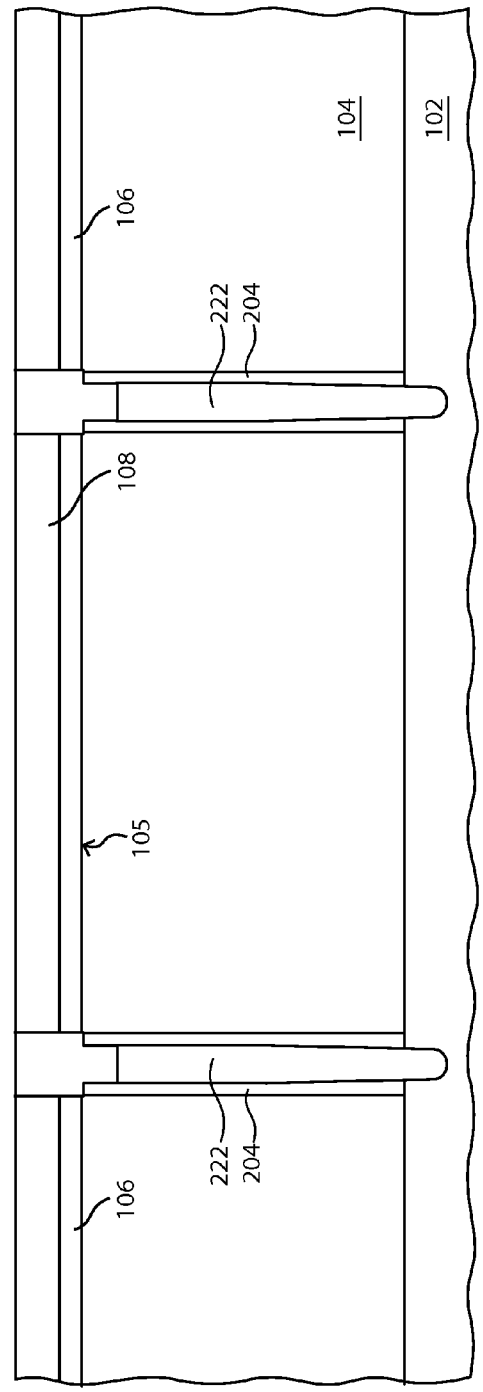

DMOS TRANSISTOR INCLUDING A GATE DIELECTRIC HAVING A NON-UNIFORM THICKNESS

FIELD OF THE DISCLOSURE

The present disclosure relates to electronic devices and processes of forming electronic devices, and more particularly to, electronic devices including dielectric layers having non-uniform thicknesses and processes of forming the same.

RELATED ART

An insulated gate field-effect transistor (IGFET) is a common type of transistor that can be used in a power switching circuit. The IGFET includes a source region, a drain region, a channel region extending between the source and drain regions, and a gate structure adjacent to the channel region. The gate structure includes a gate electrode disposed adjacent to and separated from the channel region by a gate dielectric layer.

When operating a power transistor, the drain region can be at a relatively large voltage, and significant electrical fields can exist within the transistor. Typically, a gate dielectric has a substantially uniform thickness. Doping operations in forming a body region and other similar regions may cause a portion of the drain region near the gate electrode to have less dopant than desired due to implant scattering. An additional implant operation can be performed to increase the dopant concentration at the end of the drain region immediately adjacent to channel region to help increase the doping concentration at such end. The implant operation can involve extra steps and can reduce yield. Omission of the additional implant and still achieving good electrical performance of the transistor is desired.

BRIEF DESCRIPTION OF THE DRAWINGS

Embodiments are illustrated by way of example and are not limited in the accompanying figures.

FIG. 1 includes an illustration of a cross-sectional view of a portion of a workpiece including a buried conductive region, a semiconductor layer, a pad layer, and a stopping layer.

FIG. 2 includes an illustration of a cross-sectional view of the workpiece of FIG. 1 after forming trenches, insulating spacers, and conductive plugs.

Figure 3:
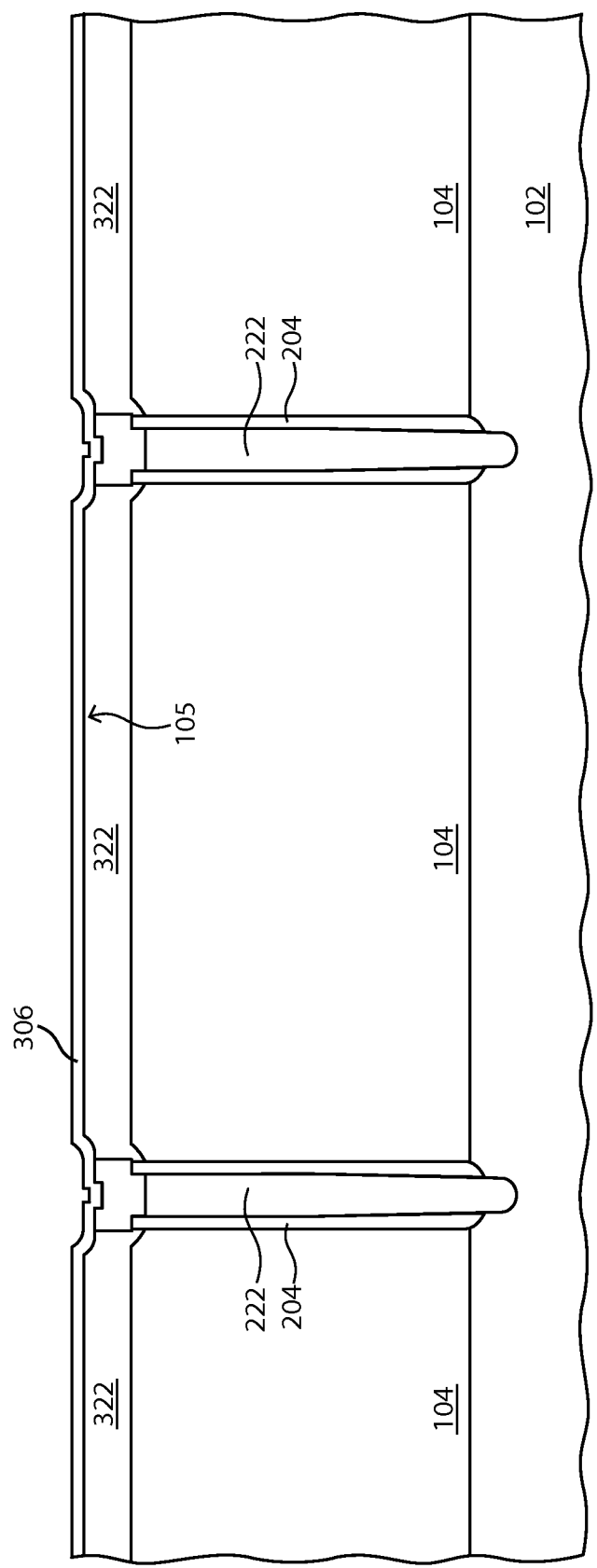
FIG. 3 includes an illustration of a cross-sectional view of the workpiece of FIG. 2 after forming a dielectric layer and horizontally-oriented doped regions.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

As used herein, the terms "horizontally-oriented" and "vertically-oriented," with respect to a region or structure, refer to the principal direction in which current flows through such region or structure. More specifically, current can flow through a region or structure in a vertical direction, a horizontal direction, or a combination of vertical and horizontal directions. If current flows through a region or structure in a vertical direction or in a combination of directions, wherein the vertical component is greater than the horizontal component, such a region or structure will be referred to as vertically oriented. Similarly, if current flows through a region or structure in a horizontal direction or in a combination of directions, wherein the horizontal component is greater than the vertical component, such a region or structure will be referred to as horizontally oriented.

The term "metal" or any of its variants is intended to refer to a material that includes an element that is within any of the Groups 1 to 12, within Groups 13 to 16, an element that is along and below a line defined by atomic numbers 13 (Al), 31 (Ga), 50 (Sn), 51 (Sb), and 84 (Po). Metal does not include Si or Ge.

The term "normal operation" and "normal operating state" refer to conditions under which an electronic component or device is designed to operate. The conditions may be obtained from a data sheet or other information regarding voltages, currents, capacitance, resistance, or other electrical parameters. Thus, normal operation does not include operating an electrical component or device well beyond its design limits.

The term "power transistor" is intended to mean a transistor that is designed to normally operate with at least a 10 V difference maintained between the source and drain or emitter and collector of the transistor when the transistor is in an off-state. For example, when the transistor is in an off-state, a 10 V may be maintained between the source and drain without a junction breakdown or other undesired condition occurring.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Group numbers corresponding to columns within the Periodic Table of Elements based on the IUPAC Periodic Table of Elements, version dated Jan. 21, 2011.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

A transistor can have a gate electrode over a stepped gate dielectric layer. The stepped gate dielectric can help to compensate for a locally lower dopant concentration within a drain region of a transistor at a location adjacent to the channel region. The stepped gate dielectric layer allows for better electrical performance as compared to a gate dielectric layer having a uniform thickness. Further, the step gate dielectric layer allows a doping sequence having about a half dozen steps to be eliminated. The concepts are better understood in view of the embodiments described below that illustrate and do not limit the scope of the present invention FIG. 1 includes an illustration of a cross-sectional view of a portion of a workpiece 100. The workpiece 100 includes a buried conductive region 102 that can include a Group 14 element (i.e., carbon, silicon, germanium, or any combination thereof) and be lightly doped or heavily doped, n-type or p-type. For the purposes of this specification, heavily doped is intended to mean a peak dopant concentration of at least $10^{19}$ atoms/cm$^3$, and lightly doped is intended to mean a peak dopant concentration of less than $10^{19}$ atoms/cm$^3$.

The buried conductive region 102 can be a portion of a heavily doped substrate (e.g., a heavily n-type doped wafer) or may be a buried doped region overlying a substrate of opposite conductivity type or overlying a buried insulating layer (not illustrated) that lies between a substrate and the buried doped region. In a particular embodiment, the buried conductive region 102 can include a lightly doped portion overlying a heavily doped portion, for example when an overlying semiconductor layer 104 has an opposite conductivity type, to help increase the junction breakdown voltage. In an embodiment, the buried conductive region 102 is heavily doped with an n-type dopant, such as phosphorus, arsenic, antimony, or any combination thereof. In a particular embodiment, the buried conductive region 102 includes arsenic or antimony if diffusion of the buried conductive region 102 is to be kept low, and in a particular embodiment, the buried conductive region 102 includes antimony to reduce the level of outgassing (as compared to arsenic) during formation of the semiconductor layer 104.

In the embodiment illustrated in FIG. 1, the semiconductor layer 104 overlies the buried conductive region 102. The semiconductor layer 104 has a primary surface 105. The semiconductor layer 104 can include a Group 14 element and any of the dopants as described with respect to the buried conductive region 102 or dopants of the opposite conductivity type. In an embodiment, the semiconductor layer 104 is a lightly doped n-type or p-type epitaxial silicon layer having a thickness in a range of approximately 0.5 microns to approximately 5.0 microns, and a doping concentration no greater than approximately $1 \times 10^{16}$ atoms/cm$^3$, and in another embodiment, a doping concentration of least approximately $1 \times 10^{14}$ atoms/cm$^3$.

If needed or desired, a buried insulating layer (not illustrated) can be disposed between the buried conductive region 102 and the semiconductor layer 104. The buried insulating layer can include an oxide, a nitride, or an oxynitride. The buried insulating layer can include a single film or a plurality of films having the same or different compositions. The buried insulating layer can have a thickness in a range of at least approximately 0.2 micron to approximately 5.0 microns. In a particular embodiment, the buried insulating layer has a thickness in a range of approximately 0.5 micron to approximately 0.9 micron.

Referring to FIG. 1, a pad layer 106 and a stopping layer 108 (e.g., a polish-stop layer or an etch-stop layer) are formed over the semiconductor layer 104 using a thermal growth technique, a deposition technique, or a combination thereof. Each of the pad layer 106 and the stopping layer 108 can include an oxide, a nitride, an oxynitride, or any combination thereof. In an embodiment, the pad layer 106 has a different composition as compared to the stopping layer 108. In a particular embodiment, the pad layer 106 includes an oxide, and the stopping layer 108 includes a nitride.

Referring to FIG. 2, portions of the semiconductor layer 104, pad layer 106, and stopping layer 108 are removed to form trenches that extend from the primary surface 105 toward the underlying buried conductive region 102. The widths of the trenches are not so wide that a subsequently-formed conductive layer is incapable of filling the trenches. In a particular embodiment, the width of each trench is at least approximately 0.3 micron or approximately 0.5 micron, and in another particular embodiment, the width of each trench is no greater than approximately 4 microns or approximately 2 microns. After reading this specification, skilled artisans will appreciate that narrower or wider widths outside the particular dimensions described may be used.

The trenches can extend to the buried conductive region 102; however, the trenches may be shallower if needed or desired.

The trenches are formed using an anisotropic etch. In an embodiment, a timed etch can be performed, and in another embodiment, a combination of endpoint detection (e.g., detecting the dopant species from the buried conductive region 102, such as arsenic or antimony) and a timed overetch may be used.

Insulating sidewall spacers 204 can be formed along the exposed sidewalls of the trenches, as illustrated in FIG. 2. The insulating sidewall spacers 204 can include an oxide, a nitride, an oxynitride, or any combination thereof. The layer from which the insulating sidewall spacers 204 are formed can be thermally grown or deposited, and the layer can be anisotropically etched to remove the layer from the bottoms of the trenches. If needed or desired, an etch can be performed to extend the trenches closer to or further into the buried conductive region 102, as illustrated in FIG. 2. In another embodiment, the insulating sidewall spacers 204 are not needed.

A conductive layer is formed over the stopping layer 108 and within the trenches. The conductive layer substantially fills the trenches. The conductive layer can include a metal-containing or semiconductor-containing material. In an embodiment, the conductive layer can include a heavily doped semiconductor material, such as amorphous silicon or polysilicon. In another embodiment, the conductive layer includes a plurality of films, such as an adhesion film, a barrier film, and a conductive fill material. In a particular embodiment, the adhesion film can include a refractory metal, such as titanium, tantalum, or the like; the barrier film can include a refractory metal nitride, such as titanium nitride, tantalum nitride, or the like, or a refractory metal-semiconductor-nitride, such as TaSiN; and the conductive fill material can include tungsten. In a more particular embodiment, the conductive layer 302 can include Ti/TiN/W. The selection of the number of films and composition(s) of those film(s) depend on electrical performance, the temperature of a subsequent heat cycle, another criterion, or any combination thereof. Refractory metals and refractory metal-containing compounds can withstand high temperatures (e.g., melting points of such materials can be at least 1400° C.), may be conformally deposited, and have a lower bulk resistivity than heavily doped n-type silicon. After reading this specification, skilled artisans will be able to determine the composition of the conductive layer to meet their needs or desires for a particular application.

A portion of the conductive layer that overlies the stopping layer 108 is removed to form vertical conductive structures 222 within the trenches, as illustrated in the embodiment of FIG. 2. The removal can be performed using a chemical-mechanical polishing or blanket etching technique. The stopping layer 108 may be used as a polish-stop or etch-stop layer. Polishing or etching may be continued for a relatively short time after the stopping layer 108 is reached to account for a non-uniformity across the workpiece with respect to the thickness of the conductive layer, the polishing or etching operation, or any combination thereof.

A continued etch or other removal operation can be used to recess the conductive structures 222 further into the trenches, if needed or desired. The recessed conductive structures 222 may allow subsequently-formed horizontally-oriented doped regions to be electrically connected to the buried conductive region 102. Exposed portions of the insulating sidewall spacers 204 within the trenches are removed. The removal can be performed using an isotropic etching technique using a wet or dry etchant. In a particular embodiment, the insulating sidewall spacers 204 include an oxide, and the stopping layer 108 includes a nitride, and therefore, the insulating sidewall spacers 204 can be selectively removed without removing a substantial amount of the stopping layer 108. At this point in the process, portions of the semiconductor layer 104 and the conductive structures 222 are exposed.

Conductive plugs are formed to complete fabrication of the vertical conductive structures 222. The conductive plugs can be formed using any of the materials and methods of formation for the lower portions of the vertical conductive structures 222. The vertical conductive structures 222 are a particular type of vertical conductive regions. In an alternate embodiment, the vertical conductive regions can be in a form of doped regions within the semiconductor layer 104 that can be formed using one or more ion implantations. The pad layer 106 and the stopping layer 108 may be removed at this point in the process.

In FIG. 3, a dielectric layer 306 and horizontally-oriented doped regions 322 are formed. The dielectric layer 306 can include any of the materials, have any of the thicknesses, and be formed using any of the techniques as described with respect to the pad layer 106. In an embodiment, the dielectric layer 306 may have the same material, thickness and be formed using the same technique as the pad layer 106. In another embodiment, the dielectric layer 306 may have a different material, a different thickness, be formed using a different technique, or any combination thereof, as compared to the pad layer 106.

The horizontally-oriented doped regions 322 can have the same conductivity type as the buried conductive region 102. In a normal operating state, the charge carriers (for example, electrons) or current flows through the horizontally-oriented doped regions 322 principally in a horizontal direction. The horizontally-oriented doped regions 322 can have a dopant concentration of less than approximately $1 \times 10^{19}$ atoms/cm$^3$ and at least approximately $1 \times 10^{16}$ atoms/cm$^3$ and a depth in one embodiment of less than approximately 0.9 micron, and in another embodiment of less than approximately 0.5 micron. In a particular embodiment, the horizontally-oriented doped regions 322 are n-type doped.

In another embodiment (not illustrated), resurf regions can be formed. The resurf regions can help keep more current flowing through the horizontally-oriented doped regions 322 instead of into the semiconductor layer 104 underlying the horizontally-oriented doped regions 322. The resurf regions may have a dopant concentration of no greater than approximately $5 \times 10^{17}$ atoms/cm$^3$ and at least approximately $1 \times 10^{16}$ atoms/cm$^3$, and a depth in one embodiment of less than approximately 1.5 microns, and in another embodiment of less than approximately 1.2 microns. The peak concentration of the resurf regions may be in a range of approximately 0.5 micron to approximately 0.9 micron below the primary surface 105. In a particular embodiment, the resurf regions are p-type doped.

Figure 4:
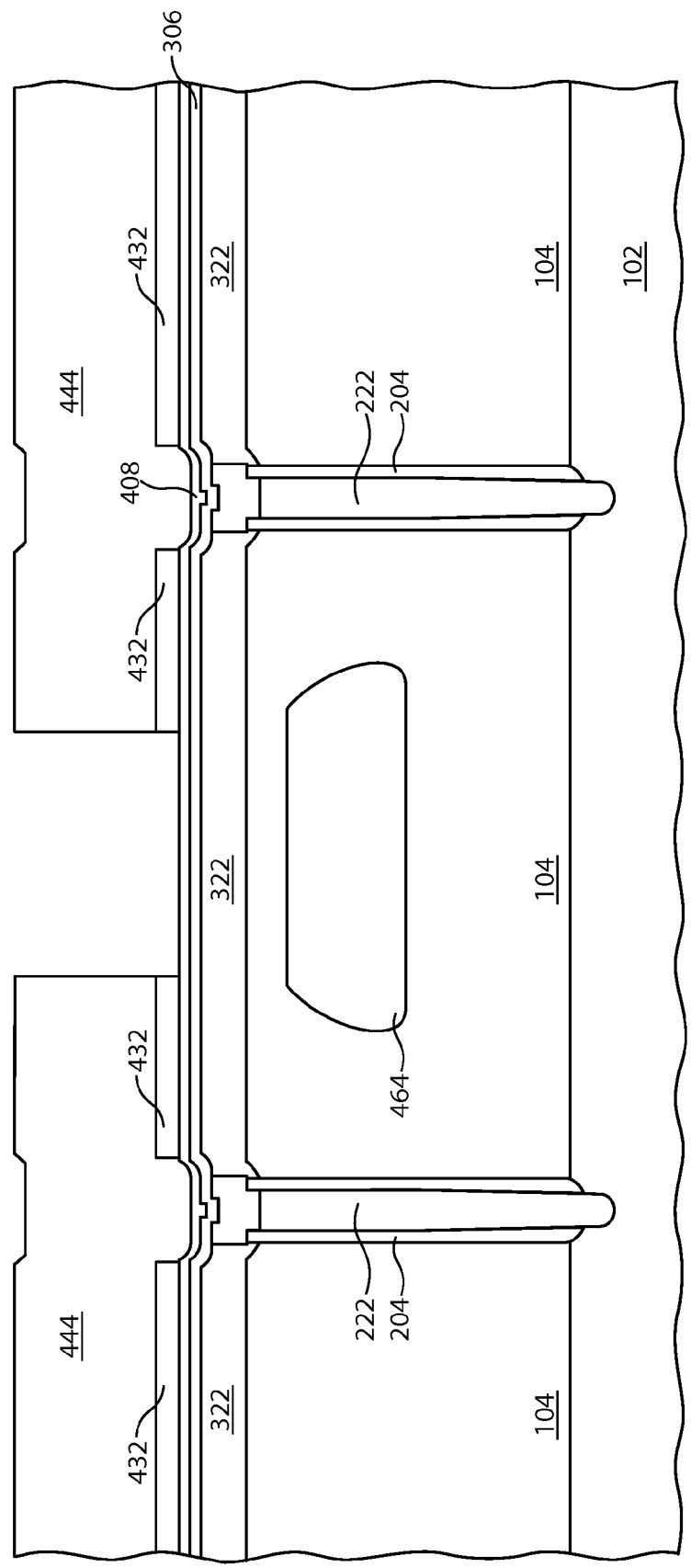
FIG. 4 includes an illustration of a cross-sectional view of the workpiece of FIG. 3 after forming an insulating layer, conductive electrodes, and a deep body doped region.

FIG. 4 includes an illustration after forming an insulating layer 408, conductive electrodes 432, an insulating layer 444, and a deep body doped region 464. The insulating layer 408 can formed using a thermal growth technique, a deposition technique, or a combination thereof. The insulating layer 408 can include an oxide, a nitride, an oxynitride, or any combination thereof. In an embodiment, the insulating layer 408 includes a nitride and has a thickness in a range of approximately 20 nm to approximately 90 nm.

The conductive layer for the conductive electrodes 432 is deposited over the insulating layer 408. The conductive layer includes a conductive material or may be made conductive, for example, by doping. More particularly, the conductive layer can include a doped semiconductor material (e.g., heavily doped amorphous silicon, polysilicon, etc.), a metal-containing material (a refractory metal, a refractory metal nitride, a refractory metal silicide, etc.), or any combination thereof. The conductive layer has a thickness in a range of approximately 0.05 micron to approximately 0.5 micron. A patterned masking layer (not illustrated) is formed over the conductive layer, wherein openings overlie the vertical conductive structures 222. Portions of the conductive layer that overlie the vertical conductive structures 222 are removed. The patterned masking layer is removed.

The insulating layer 444 can be formed using one or more insulating films. In the embodiment as illustrated in FIG. 4, an insulating layer 444 is deposited over the conductive layer and exposed portions of the insulating layer 408. The insulating layer 444 can include an oxide, a nitride, or any oxynitride. The insulating layer 444 has a thickness in a range of approximately 0.2 micron to approximately 2.0 microns. A patterned masking layer (not illustrated) is formed over the insulating layer 444 and patterned to define an opening where the transistor is being formed. Portions of the conductive layer are patterned, and the masking features are removed. Remaining portions of the conductive layer are the conductive electrode members 432 that can help to reduce drain-to-gate capacitance in the transistor. The patterned masking layer is removed.

The deep body doped regions 464 can be formed using a single implant or a combination of implants. For a single implant or for the implant (of a combination of implants) having the lowest projected range, the dose can be in a range of approximately $5 \times 10^{13}$ ions/cm$^2$ to approximately $5 \times 10^{14}$ ions/cm$^2$.

Figure 5:
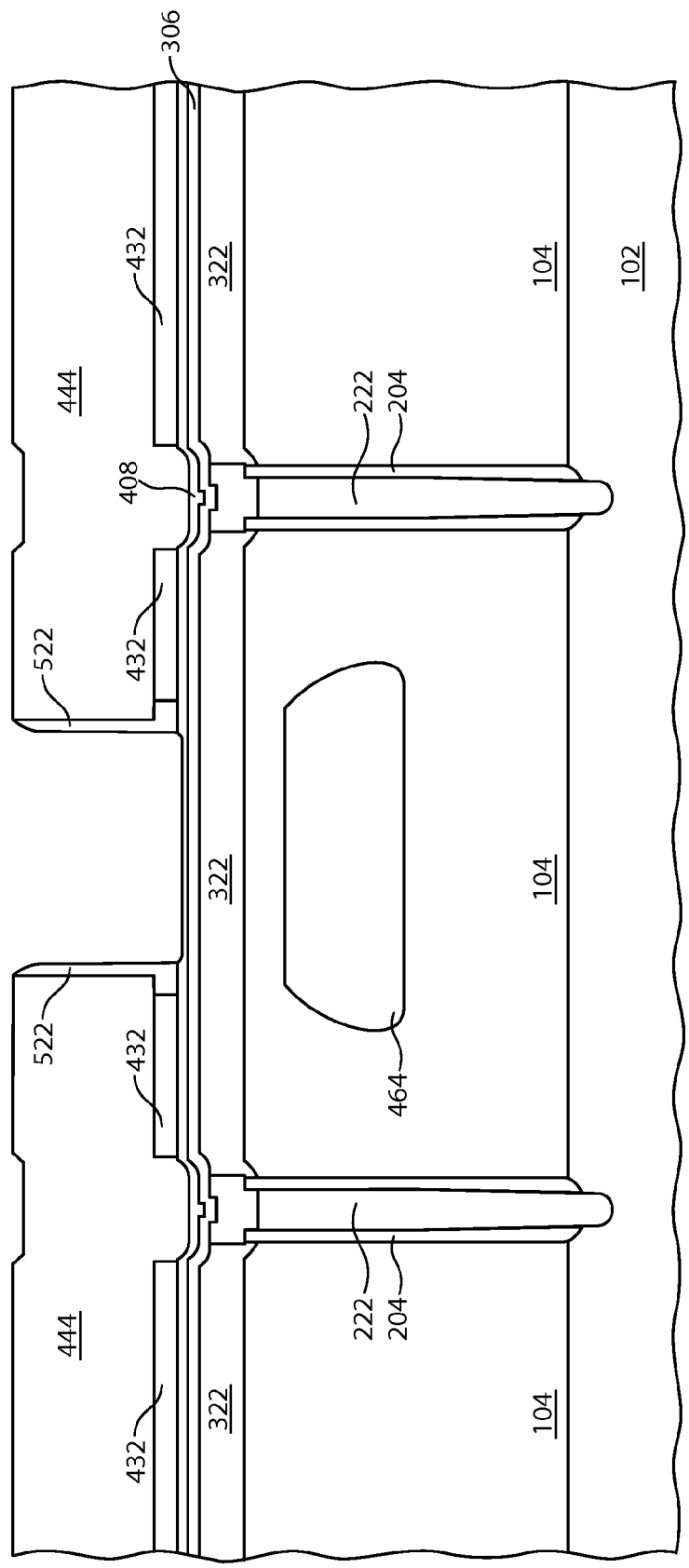
FIG. 5 includes an illustration of a cross-sectional view of the workpiece of FIG. 4 after forming insulating sidewall spacers.

FIG. 5 includes an illustration of the workpiece after removing further portions of the conductive electrodes 432 and forming insulating spacers 522. The removal of such portions of the conductive electrodes 432 can help to reduce the likelihood of an unintended electrical short between the conductive electrodes and the subsequently-formed gate electrodes. The conductive electrodes 432 can be etched using an isotropic etchant. Portions of the insulating layer 444 are undercut where portions of the conductive electrodes 432 are removed. The removal can laterally recess the conductive electrodes 432 in a range of approximately 5 nm to approximately 200 nm. In an alternative embodiment, the removal is not performed.

The insulating spacers 522 are formed along the sidewalls of the insulating layer 444. In a particular embodiment, the insulating spacers 522 can include an oxide, a nitride, an oxynitride, or any combination thereof. The insulating spacers 522 can be formed by depositing a layer to a thickness in a range of approximately 20 nm to approximately 200 nm and anisotropically etching the layer to form the insulating spacers 522. Openings defined by the insulating spacers 522 help to keep portions of the horizontally-oriented doped regions 322 that will be near subsequently-formed gate electrodes from being counterdoped during doping steps for channel and body regions.

Figure 6:
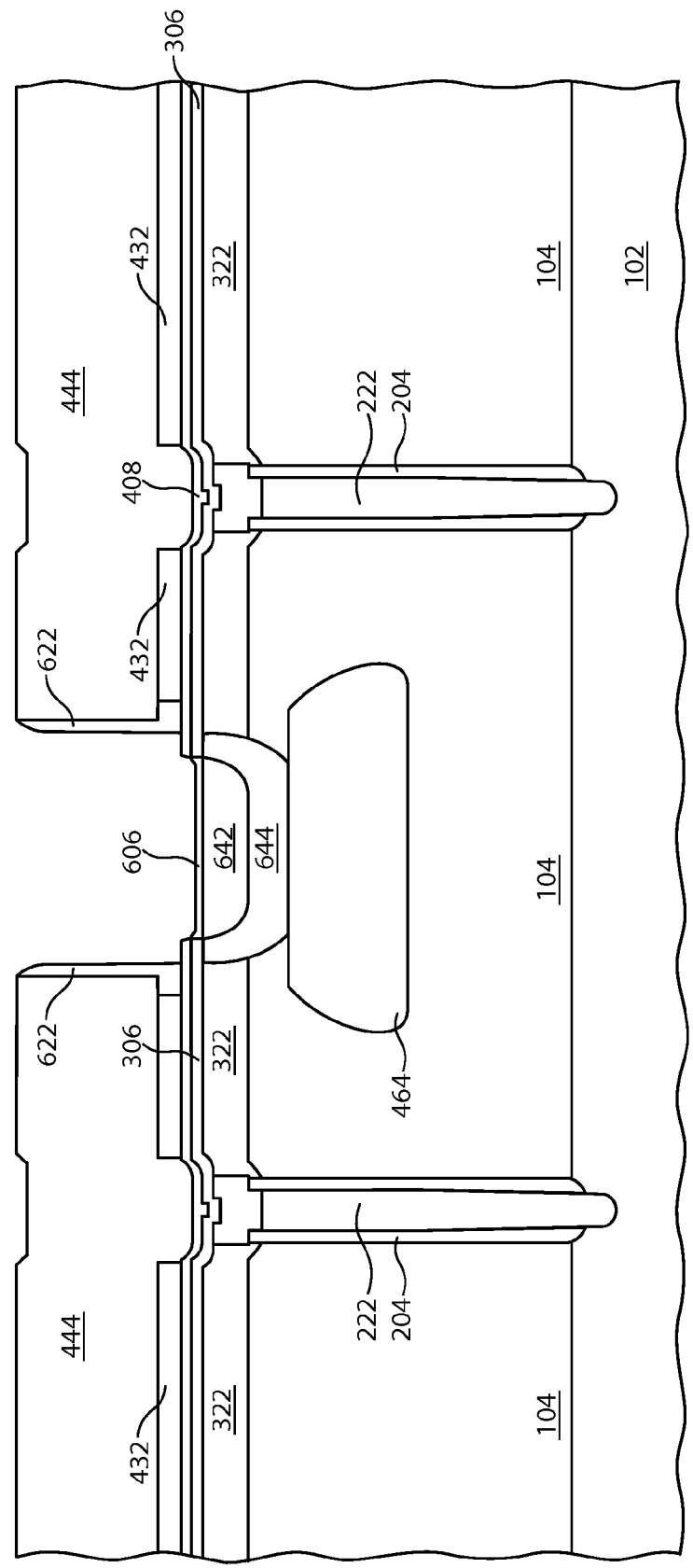
FIG. 6 includes an illustration of a cross-sectional view of the workpiece of FIG. 5 after forming a dielectric layer, a channel region, a body region, and etching portions of the insulating sidewall spacers.

FIG. 6 includes an illustration after forming a channel region 642, a body region 644, and a dielectric layer 606. The channel region 642 may have a depth no greater than the depth of the horizontally-oriented doped regions 322. The channel region 642 can be formed by ion implantation using a dose of approximately $1.0 \times 10^{13}$ atoms/cm$^2$ to approximately $1.0 \times 10^{14}$ atoms/cm$^2$ at an energy of approximately 15 KeV to approximately 40 KeV. The body region 644 can help link the channel region 642 to the deep body doped region 464. The body region 644 can be formed by ion implantation using a dose of approximately $1.0 \times 10^{13}$ atoms/cm$^2$ to approximately $1.0 \times 10^{14}$ atoms/cm$^2$ at an energy of approximately 40 KeV to approximately 120 KeV. In another embodiment, the energy can be selected to achieve a projected range in a range of approximately 0.05 micron to approximately 0.3 micron. Other body and channel regions substantially identical to the channel region 642 and 644 can be formed for other transistor structures (not illustrated) if the workpiece includes other transistor structures.

The exposed portion of the dielectric layer 306 is removed by etching, and the dielectric layer 606 is formed over the exposed surface along the bottoms of the opening where the exposed portion of the dielectric layer 306 was removed. Portions of the insulating spacer 522 may be removed during the removal of the portions of the dielectric layer 206 to form insulating spacer 622. In an embodiment, the dielectric layer 606 includes an oxide, a nitride, an oxynitride, or any combination thereof and has a thickness in a range of approximately 5 nm to approximately 50 nm.

Figure 7:
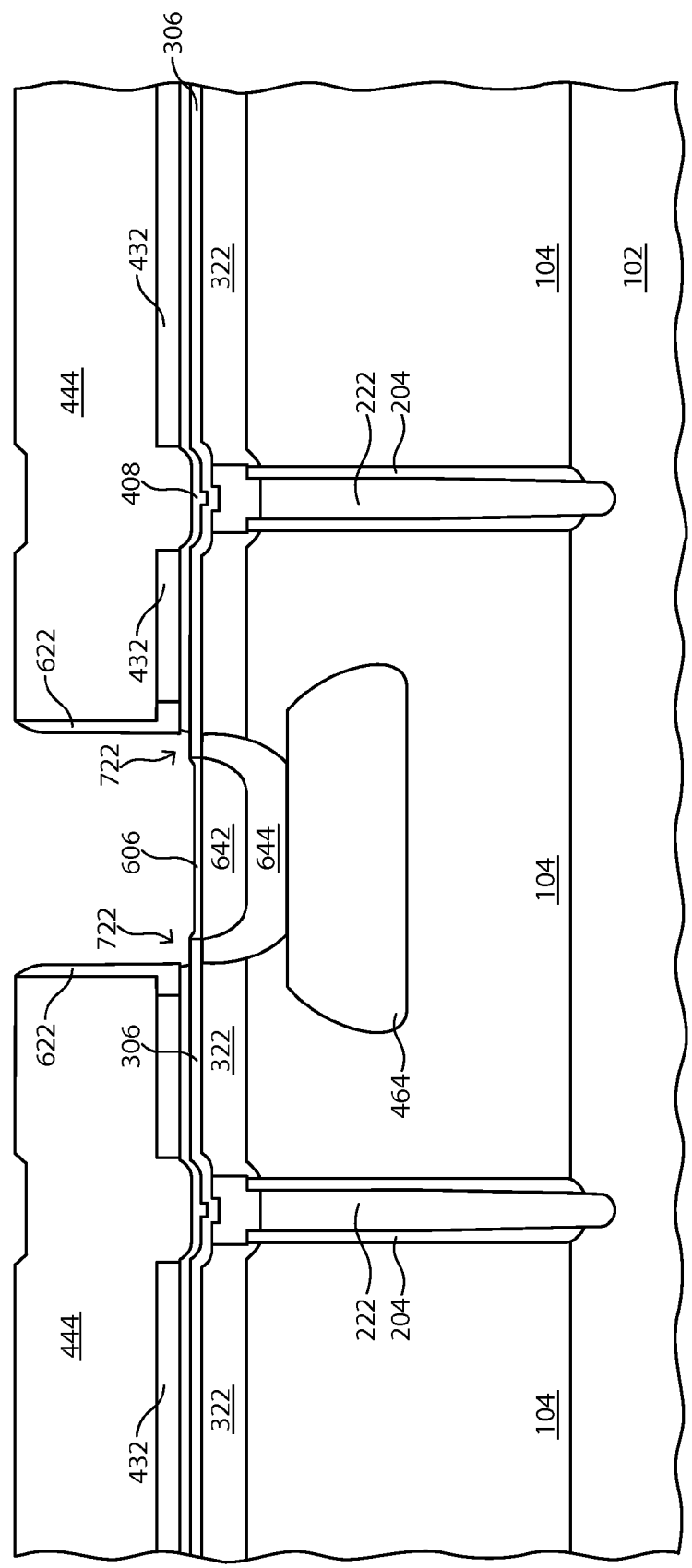
FIG. 7 includes an illustration of a cross-sectional view of the workpiece of FIG. 6 after removing portions of an insulating layer to form undercuts under the insulating sidewall spacers.

A portion of the insulating layer 408 within the opening and under the insulating spacers 622 is removed, as illustrated in FIG. 7. In an embodiment, an isotropic etch is performed to remove the portions of the insulating layer 408. In a particular embodiment, the insulating layer 408 has a different composition as compared to the dielectric layers 306 and 606, so that the insulating layer 408 can be selectively etched in preference to the dielectric layers 306 and 606. The distance of the recession, which is the distance from the edge of the insulating layer 408 to an exposed side surface of the insulation spacers 622 can be in a range of approximately 2 nm to approximately 50 nm.

Figure 8:
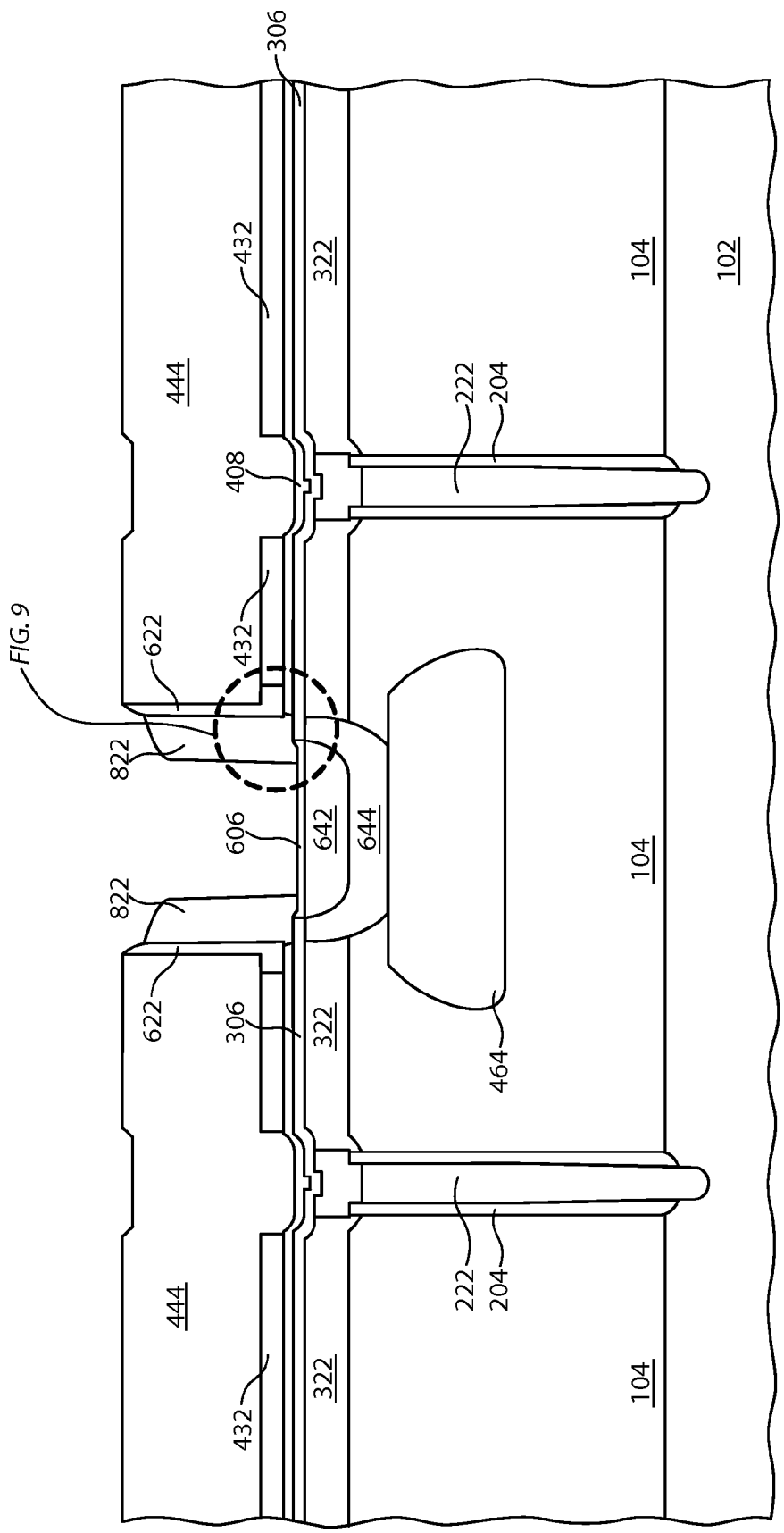
FIG. 8 includes an illustration of a cross-sectional view of the workpiece of FIG. 7 after forming gate electrodes.
Figure 9:
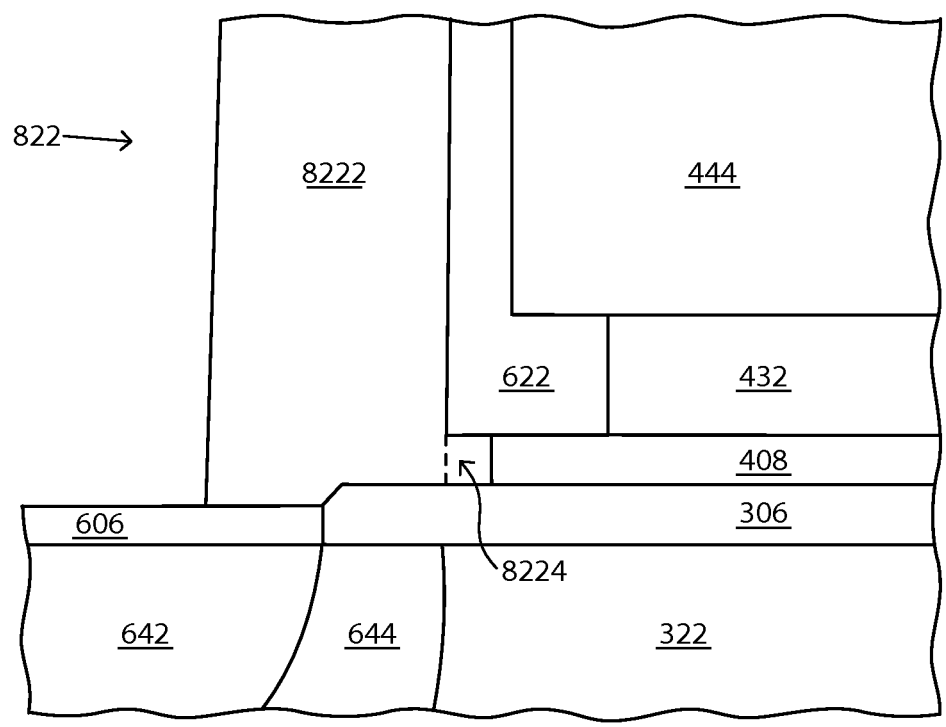
FIG. 9 includes an enlarged view of a portion of FIG. 8.

FIG. 8 includes an illustration of the workpiece after forming gate electrodes 822. The gate electrodes 822 are disposed over the portions of the dielectric layers 306 and 606. Thus, the gate dielectric layer for the transistor includes portions of the dielectric layers 306 and 606 that are adjacent to the gate electrodes 822. FIG. 9 includes an enlarged view of a portion of FIG. 8 to illustrate better the positional relationships of features at this point in the process. The gate electrode 822 includes a main body portion 8222 and a tail portion 8224. In the embodiment as illustrated in FIG. 9, the main body portion 8222 overlies the channel region 642, the body region 644, and the dielectric layers 306 and 606. The main body portion 8222 lies along a side of the insulating spacer 622 and at elevations below a lowest elevation of the conductive electrodes 432 and above a highest elevation of the conductive electrodes 432. The tail portion 8224 is disposed in a region that corresponds to where the insulating layer 408 has been removed. The other gate electrode 822 in FIG. 8 is substantially a mirror image of the gate electrode 822 as illustrated in FIG. 9 and would have substantially the same features as the gate electrode 822 in FIG. 9. In another embodiment (not illustrated), the tail portion 8224 may extend over a portion of the body region 644, the channel region 642, or both. In a further embodiment, the tail portion 8224 may extend under the insulating layer 444. The tail portion 8224 is disposed between the dielectric layer 306 and an insulating material, such as the insulating spacer 622, the insulating layer 444, or both.

The gate electrodes 822 can be formed by depositing a layer of material that is conductive as deposited or can be subsequently made conductive. The layer of material can include a metal-containing or semiconductor-containing material. In an embodiment, the layer is deposited to a thickness of approximately 0.1 micron to approximately 0.5 micron. The layer of material is etched to form the gate electrodes 822. In the illustrated embodiment of FIG. 8, the gate electrodes 822 are formed without using a mask and have shapes of sidewall spacers. The widths of the gate electrodes 822 at their bases are substantially the same as the thickness of the layer as deposited.

Figure 10:
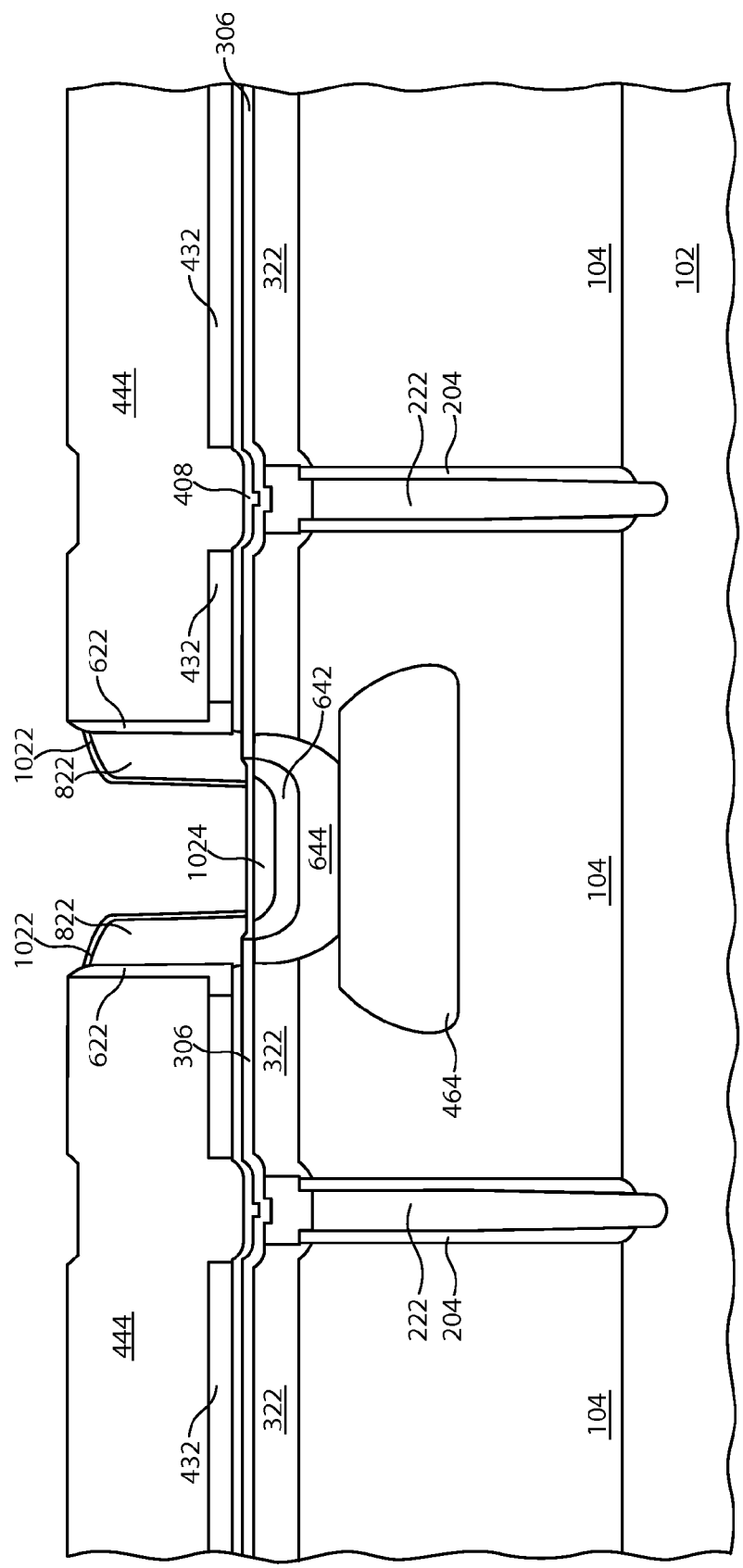
FIG. 10 includes an illustration of a cross-sectional view of the workpiece of FIG. 8 after forming an insulating layer over the gate electrodes and forming a source region.

FIG. 10 includes an illustration of the workpiece after forming an insulating layer 1022 along exposed surfaces of the gate electrodes 822 and after forming a source region 1024. The insulating layer 1022 can be thermally grown from the gate electrodes 822 or may be deposited over the workpiece. The thickness of the insulating layer 1022 can be in a range of approximately 10 nm to approximately 30 nm. The source region 1024 is formed from a portion of the channel region 642. The source region 1024 can include extension portions and a heavily doped portion. The extension portions can have a dopant concentration higher than approximately $5 \times 10^{17}$ atoms/cm$^3$ and less than approximately $5 \times 10^{19}$ atoms/cm$^3$. If needed or desired, an additional set of insulating spacers (not illustrated) may be formed before forming the heavily doped portion of the source region 1024. Such insulating spacers are formed to cover the extension portions of the source region 1024 and to displace the heavily doped portion further from the gate electrodes 822. The insulating spacers can be formed by depositing an insulating layer and anisotropically etching the insulating layer. The insulating spacers can include an oxide, a nitride, an oxynitride, or any combination thereof, and have widths at the bases of the insulating spacers in a range of approximately 50 nm to approximately 200 nm. The doping for the heavily doped portion of the source region 1024 can be performed after the insulating layer 1022 is formed. The heavily doped portion of the source region 1024 allows ohmic contacts to be subsequently made and has a dopant concentration of at least approximately $1 \times 10^{19}$ atoms/cm$^3$. The source region 1024 can be formed using ion implantation, have an opposite conductivity type as compared to the channel region 642, and the same conductivity type as the horizontally-oriented doped regions 322 and the buried conductive region 102. Other source regions substantially identical to the source region 1024 can be formed for other transistor structures (not illustrated) if the workpiece includes other transistor structures.

Figure 11:
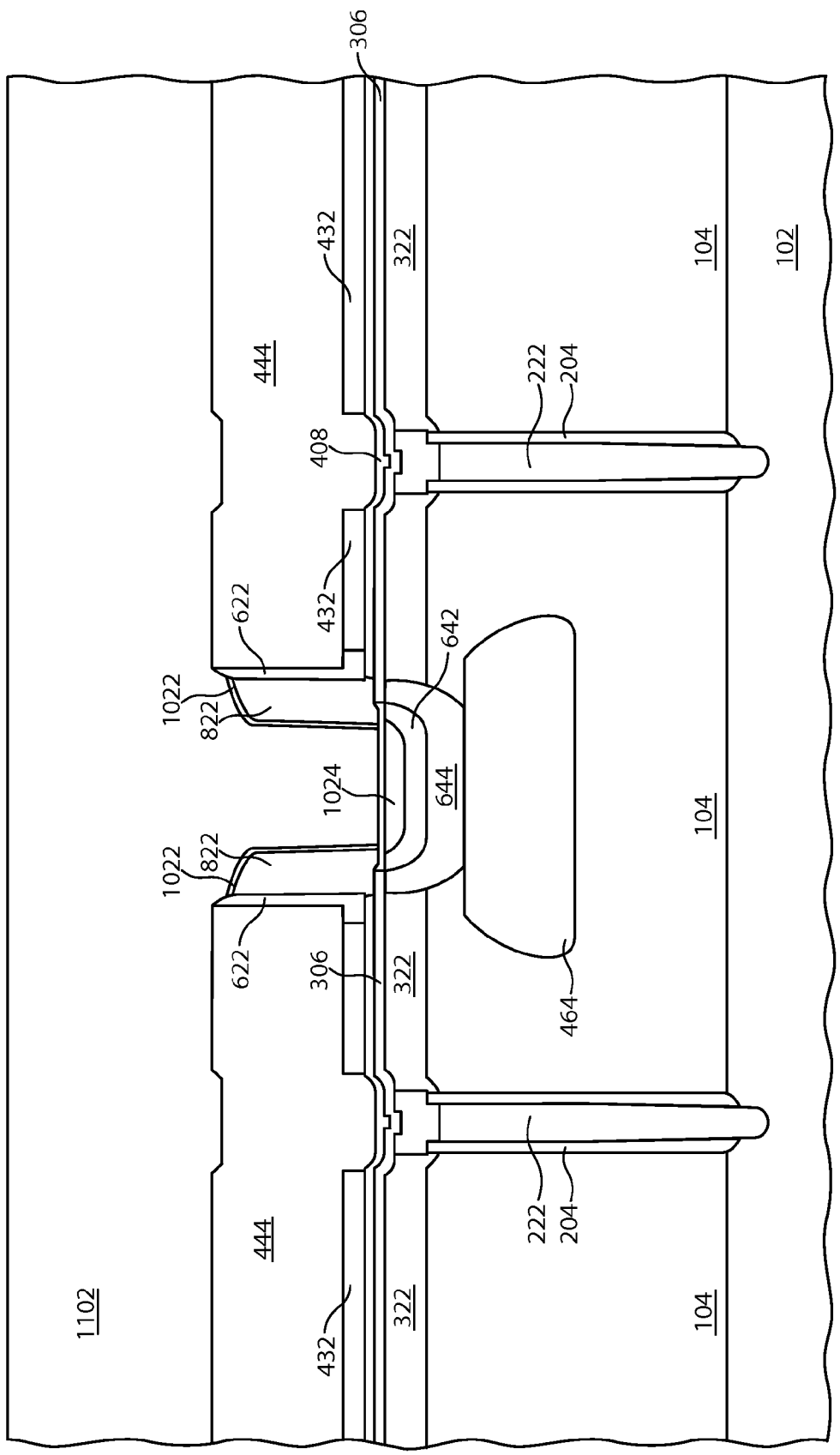
FIG. 11 includes an illustration of a cross-sectional view of the workpiece of FIG. 10 after forming an interlevel dielectric layer.

FIG. 11 includes an illustration of the workpiece after forming an interlevel dielectric (ILD) layer 1102 over the insulating layer 444, the gate electrodes 822, and the source region 1024. The ILD layer 1102 can include an oxide, a nitride, an oxynitride, or any combination thereof. The ILD layer 1102 can include a single film having a substantially constant or changing composition (e.g., a high phosphorus content further from the semiconductor layer 104) or a plurality of discrete films. An etch-stop film, an antireflective film, or a combination may be used within or over the ILD layer 1102 to help with processing. The ILD layer 1102 can be deposited to a thickness in a range of approximately 0.5 micron to approximately 2.0 microns. In the embodiment as illustrated in FIG. 11, the ILD layer 1102 is not planarized. In another embodiment, the ILD layer 1102 may be planarized if needed or desired.

Figure 12:
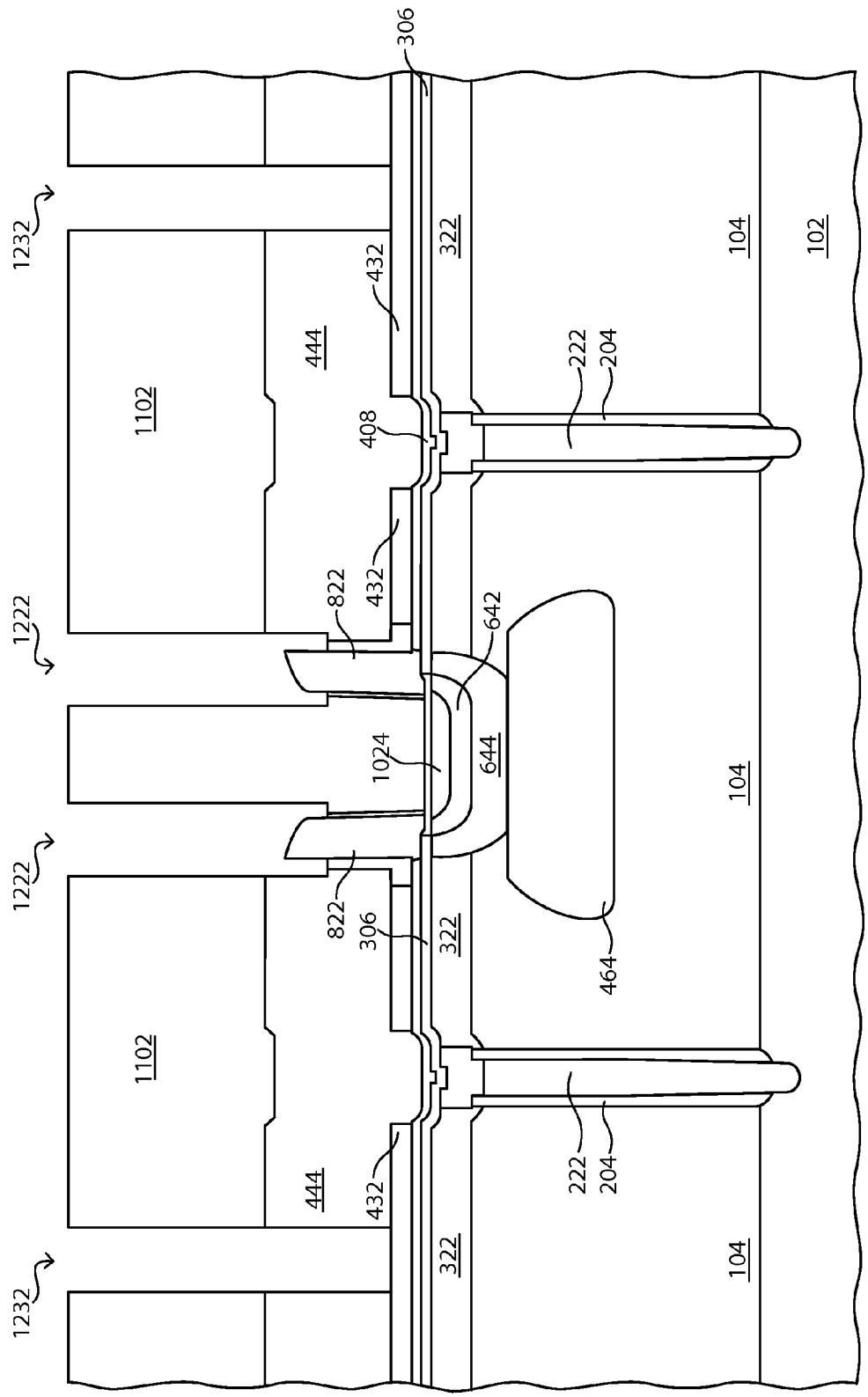
FIG. 12 includes an illustration of a cross-sectional view of the workpiece of FIG. 11 after forming patterning the interlevel dielectric layer and a particular insulating layer to define contact openings over the conductive electrodes and gate electrodes.

FIG. 12 includes an illustration after portions of the ILD layer 1102 and the insulating layer 444 are patterned to define contact openings 1222 and 1232. A patterned masking layer (not illustrated) is formed over the workpiece and defines openings under which the contact openings 1222 and 1232 will be located. Exposed portions of the ILD layer 1102 and the insulating layer 444 are etched to define the contact openings 1222 and 1232. In the embodiment as illustrated in FIG. 12, the contact openings 1222 expose portions of the gate electrodes 822, and the contact openings 1232 expose portions of the conductive electrodes 432. The patterned masking layer is removed after etching to define the contact openings 1222 and 1232.

Figure 13:
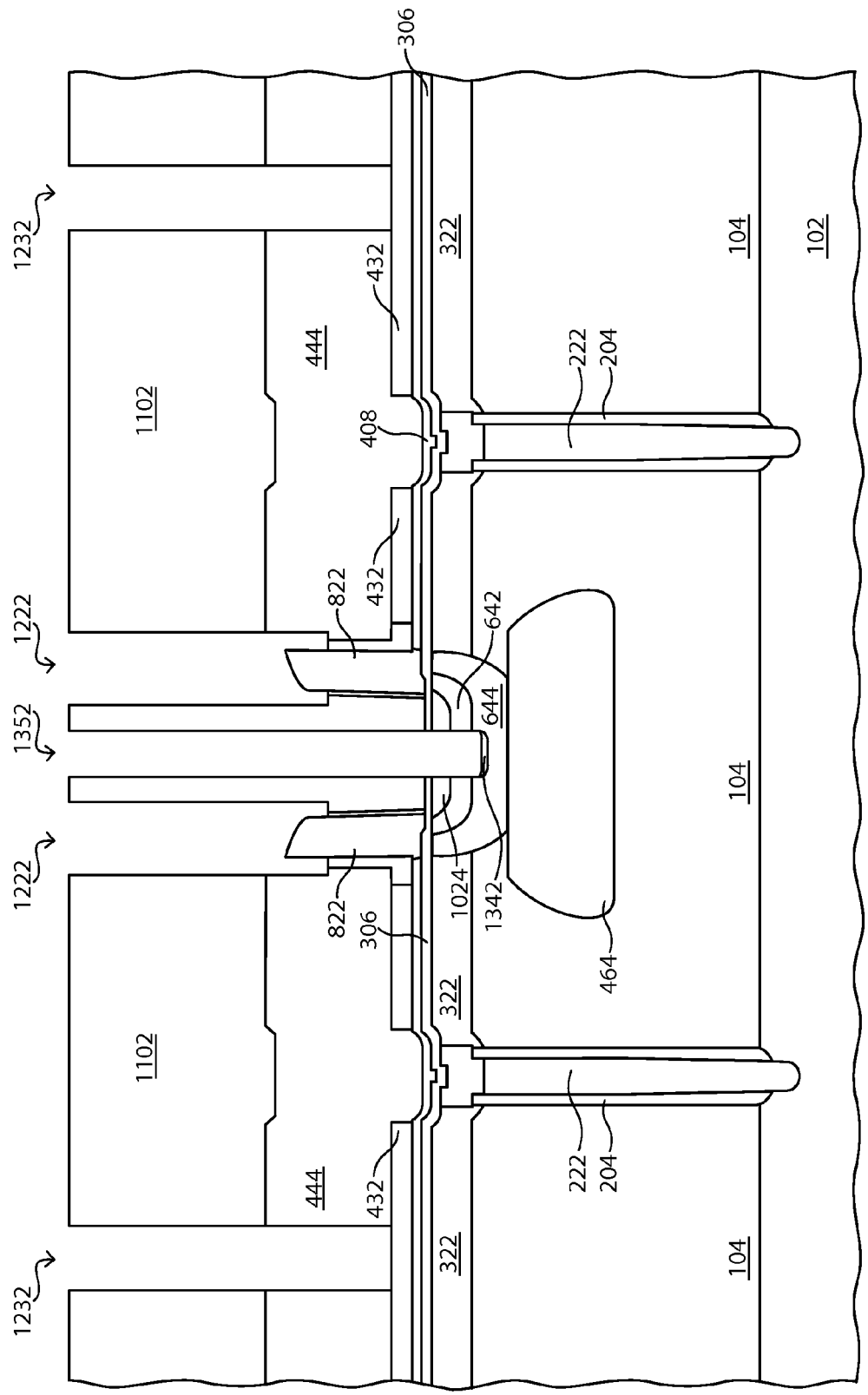
FIG. 13 includes an illustration of a cross-sectional view of the workpiece of FIG. 12 after patterning the interlevel dielectric layer and a particular dielectric layer to define a contact opening extending to the body region and after forming a heavily doped region along a bottom of such opening.

FIG. 13 includes an illustration of the workpiece after defining an opening 1352 and a heavily doped region 1342. The contact opening 1352 can be defined before or after the other contact openings illustrated and described in FIG. 12. The opening 1352 allows for a source/body contact to be made for the transistor. A patterned masking layer (not illustrated) is formed over the workpiece and defines an opening under which the contact opening 1352 will be located. Exposed portions of the ILD layer 1102 and the dielectric layer 606 are etched to define the contact opening 1352. Etching is continued to etch through the source region 1024 and exposes a portion of the body region 644 along the bottom of the contact opening 1352. The patterned masking layer can be removed at this time. The bottom of the opening 1352 can be doped to form the heavily doped region 1342, which allows an ohmic contact to be formed to the body region 644. The heavily doped region 1342 has the same conductivity type as body region 644 and a dopant concentration of at least $1 \times 10^{19}$ atoms/cm$^3$.

In an embodiment, after defining the contact opening 1352 and before forming the heavily doped region 1342, a sacrificial layer (not illustrated) may be formed along exposed portions of source region 1024 to reduce the likelihood of counterdoping of such region. If needed or desired, the sacrificial layer may be anisotropically etched along the bottom of the opening 1352. The heavily doped region 1342 may be formed by ion implantation or another suitable doping technique. The workpiece may be annealed to activate the dopants introduced into the workpiece during the contact opening process sequence. After doping and anneal, the sacrificial layer is removed to expose portions of the source region 1024 within the contact opening 1352. Although FIG. 13 illustrates the contact openings 1222 and 1352 as being very close together, in practice, such openings 1222 and 1352 may be farther apart. For example, the contact opening 1352 may be displaced along a different plane, such as farther into the structure as illustrated in FIG. 13.

Figure 14:
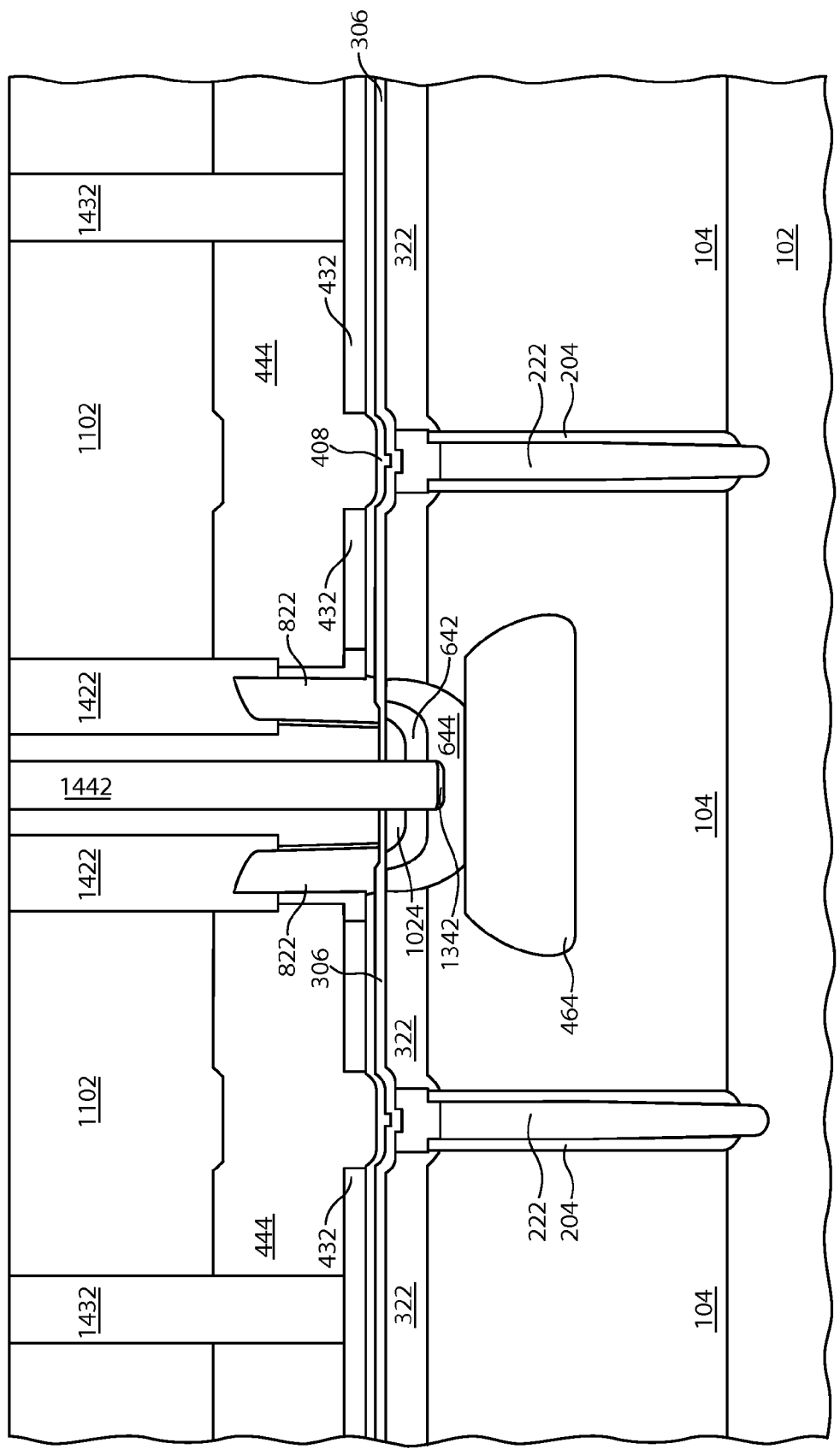
FIG. 14 includes an illustration of cross-sectional views of the workpiece of FIG. 13 after forming conductive plugs within the contact openings.

FIG. 14 includes an illustration after forming conductive plugs 1422, 1432, and 1442. The conductive plugs 1422 are electrically connected to the gate electrodes 822 of the transistor, the conductive plug 1442 is electrically connected to the source region 1024 and the body of the transistor, the conductive plugs 1432 are electrically connected to the conductive electrodes 432. In an embodiment, none of conductive plugs within the ILD layer 1102 is electrically connected to the horizontally-oriented doped regions 322. A drain for the transistor includes portions of the horizontally-oriented doped regions 322 that are electrically connected to the buried conductive region 102.

In an embodiment, the conductive plugs 1422, 1442, and 1432 can be formed using a plurality of films. In an embodiment, a layer including a refractory metal, such as Ti, Ta, W, Co, Pt, or the like, can be deposited over the workpiece and within the openings 1222, 1232, and 1352. If needed or desired, a layer including a metal nitride layer can be deposited over the layer including the refractory metal. The workpiece can be annealed so that portions of the layer including the refractory metal are selectively reacted with exposed silicon, such as substantially monocrystalline or polycrystalline silicon, to form a metal silicide. Thus, portions of the gate electrodes 822, conductive electrodes 432, source region 1024, horizontally-oriented doped regions 322, and body region 644, and heavily doped regions 1342 can react with the metal within the layer that includes the refractory metal to form a metal silicide. Portions of the layer that include the refractory metal that contact insulating layers do not react. A metal nitride layer may be formed to further fill a part, but not the remainder, of the openings. The metal nitride layer and can act as a barrier layer. A layer of a conductive material fills the remainder of the contact openings 1222, 1232, and 1352. Portions of the layer including the refractory metal, the metal nitride layer and the conductive material that overlies the ILD layer 1102 are removed to form the conductive plugs 1422, 1432, and 1442.

Figure 15:
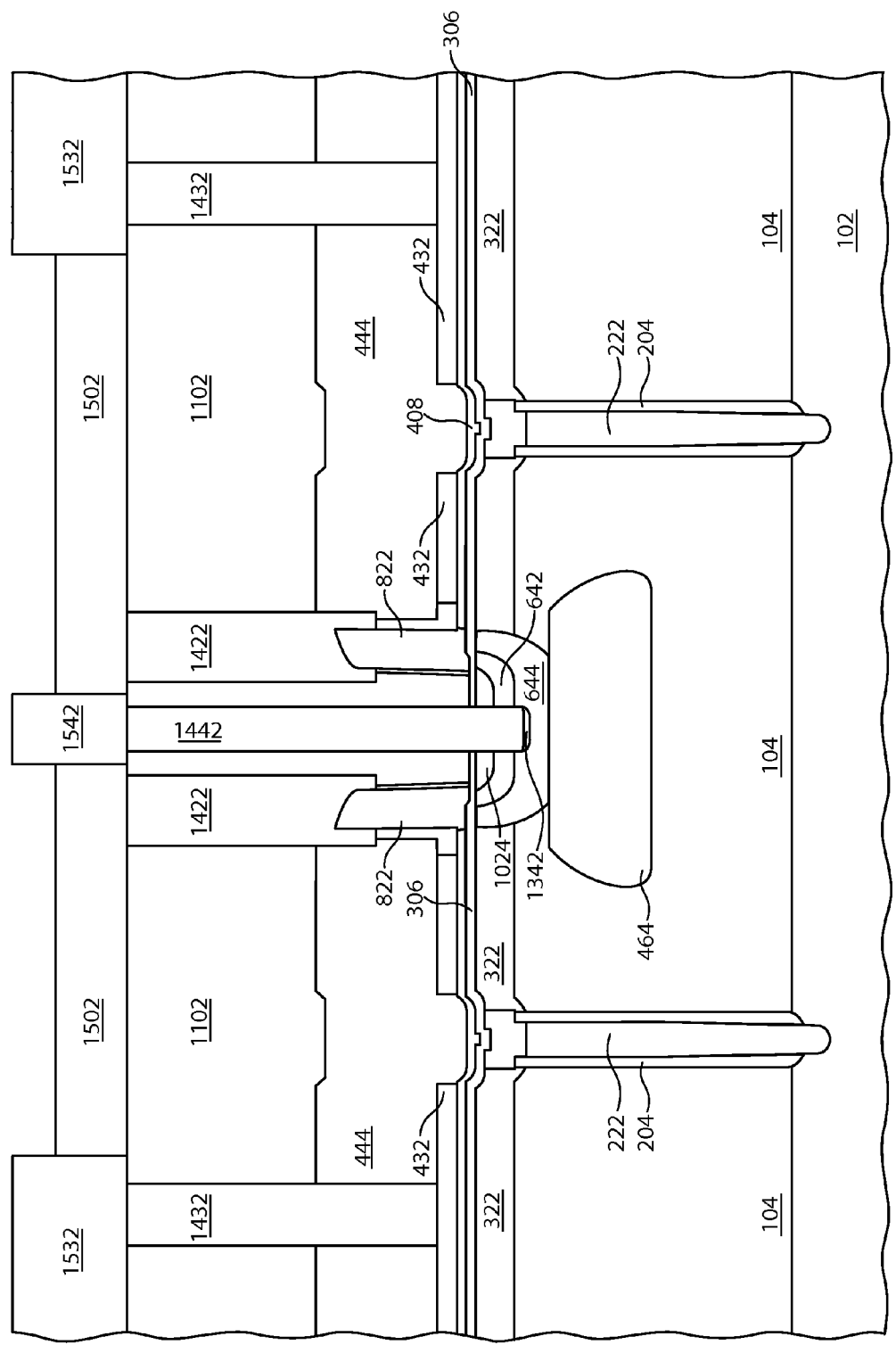
FIG. 15 includes an illustration of a cross-sectional view of the workpiece of FIG. 14 after forming a first level of interconnects.

FIG. 15 includes an illustration of the workpiece after a first level of interconnects are formed. The ILD layer 1502 can include any of the compositions as previously described with respect to the ILD layer 1102. The ILD layer 1502 can have substantially the same composition or a different composition as compared to the ILD layer 1102. The ILD layer 1502 is patterned to define via openings. Interconnects 1532 and 1542 are formed and extend at least partly within the via openings within the ILD layer 1502. The interconnects 1532 are electrically connected to the conductive electrodes 432, and the interconnect 1542 is electrically connected to the source region 1024 of the transistor. In the finished electronic device, the source region 1024 and the conductive electrodes 432 are electrically connected to each other. The interconnects 1532 and 1542 may be different parts of the same interconnect or may be different interconnects that are electrically connected at a different level of interconnects. An interconnect (not illustrated) is electrically connected to the gate electrode 622 via the conductive plug 1422 at a location not illustrated in FIG. 15.

Although not illustrated, additional or fewer layers or features may be used as needed or desired to form the electronic device. Field isolation regions are not illustrated but may be used to help electrically isolate portions of the power transistor. In another embodiment, more insulating and interconnect levels may be used. A passivation layer can be formed over the workpiece or within the interconnect levels. After reading this specification, skilled artisans will be able to determine layers and features for their particular application.

The electronic device can include many other transistor structures that are substantially identical to the transistor structures and as illustrated in FIG. 15. The transistor structures can be connected in parallel to each other to form the transistor. Such a configuration can give a sufficient effective channel width of the electronic device that can support the relatively high current flow that is used during normal operation of the electronic device. The transistor is well suited for use in power switching applications, such as a high-frequency voltage regulator.

The combination of the dielectric layers 306 and 606 under the gate electrodes 822 is a stepped gate dielectric layer that can help with the performance of the transistor without needing an additional doping sequence that may include about a half dozen steps. The portion of the horizontally-oriented doped region 322 closer to the channel region 642 can have a locally lower dopant concentration due to implant scatter when forming the deep body doped region 464, the body region 644, or both. The relatively thicker dielectric layer 306 near the horizontally-oriented doped region 322 helps to compensate for the locally lower dopant concentration of the horizontally-oriented doped region 322 at a location adjacent to the channel region 642, without increasing the gate-to-drain capacitance as much as would a comparatively thinner dielectric layer with a substantially uniform thickness similar to that of dielectric layer 606. Conversely, threshold voltage or one or more electronic parameters of the transistor may be better controlled with the relatively thinner dielectric layer 606 near the source region 1024, as compared to a substantially identical transistor with a comparatively thicker dielectric layer with a substantially uniform thickness similar to that of dielectric layer 306. The stepped gate dielectric structure can combine advantages of a thinner dielectric layer near the source region and a thicker dielectric layer near the drain region. Accordingly, the extra processing, handling, and yield loss associate with an additional doping sequence are substantially eliminated.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Item 1. An electronic device can include a drain region of a transistor, a source region of the transistor, a dielectric layer, and a gate electrode of transistor. The dielectric layer can include a first portion and a second portion, wherein the first portion has a first thickness and is closer to the drain region than to the source region, the second portion has a second thickness and is closer to the source region than to the drain region, the first thickness is greater than the second thickness. The gate electrode can overlie the first and second portions of the dielectric layer, wherein the dielectric layer includes a gate dielectric of the transistor.

Item 2. The electronic device of Item 1, wherein the transistor is a power transistor.

Item 3. The electronic device of Item 1, wherein first thickness is no greater than approximately 90 nm.

Item 4. The electronic device of Item 1, wherein the gate electrode has a first height over the first portion of the dielectric layer and a second height over the second portion of the first dielectric layer, wherein the first height is less than the second height.

Item 5. The electronic device of Item 1, further including a conductive electrode, wherein the first portion of the dielectric layer is disposed between the drain region and the conductive electrode, a lower elevation of the gate electrode is below a lowest elevation of the conductive electrode, and a higher elevation of the gate electrode is above a highest elevation of the conductive electrode.

Item 6. The electronic device of Item 1, wherein from a cross-sectional view, the gate electrode has a shape of a sidewall spacer.

Item 7. The electronic device of Item 1, wherein the gate electrode has a tail portion extending from a main body of the gate electrode, the tail portion of the gate electrode overlies the first portion of the dielectric layer, and the main body of the gate electrode overlies the second portion of the dielectric layer.

Item 8. The electronic device of Item 7, wherein from a top view, the main body of the gate electrode is disposed between the source region and the tail portion of the gate electrode.

Item 9. The electronic device of Item 7, further including an insulating material adjacent to a side of the gate electrode, wherein the insulating material has a height that is at least approximately 50% of a maximum height of the gate electrode, the tail portion of the gate electrode is disposed between the first portion of the dielectric layer and the insulating material, and from a top view, substantially none of the main body of the gate electrode is disposed between the first portion of the dielectric layer and the insulating material.

Item 10. The electronic device of Item 9, further including a nitride layer disposed between the first portion of the dielectric layer and the insulating material, wherein the nitride layer is laterally adjacent to the tail portion of the gate electrode.

Item 11. The electronic device of Item 1, further including a buried conductive region and a semiconductor layer having a primary surface and an opposing surface, wherein the buried conductive region is disposed closer to the opposing surface than to the primary surface. The electronic device still further includes a vertical conductive region adjacent to the primary surface and extending through the semiconductor layer toward the buried conductive region, wherein the vertical conductive region is electrically connected to the buried conductive region and the drain region or the source region.

Item 12. The electronic device of Item 11, wherein the drain region and the first and second portions of the dielectric layer are adjacent to the primary surface.

Item 13. A process of forming an electronic device can include forming a first dielectric layer adjacent to a semiconductor layer, forming a drain region of a transistor after forming the first dielectric layer, forming a second dielectric layer after forming the drain region, and forming a gate electrode of the transistor over the first and second dielectric layers.

Item 14. The process of Item 13, further including forming a source region of the transistor, wherein the first dielectric layer has a first thickness, and the drain region is closer to the first dielectric layer than to the second dielectric layer, the second dielectric layer has a second thickness, and the source region is closer to the second dielectric layer than the first dielectric layer, and the first thickness is greater than the second thickness.

Item 15. The process of Item 14, further including providing a buried conductive region and a semiconductor layer having a primary surface and an opposing surface, wherein the buried conductive region is disposed closer to the opposing surface than to the primary surface; and forming a vertical conductive region adjacent to the primary surface and extending through the semiconductor layer toward the buried conductive region. In a finished electronic device, the first vertical conductive region is electrically connected to the buried conductive region and the drain region or a source region of the transistor.

Item 16. The process of Item 13, further including removing a portion of the first dielectric layer, wherein forming the second dielectric layer is formed such that the second dielectric layer is disposed at a location from which the portion of the first dielectric layer was removed.

Item 17. The process of Item 13, further including forming a nitride layer over the first dielectric layer, forming an insulating layer over the nitride layer, and removing a portion of the nitride layer under the insulating layer, wherein forming the gate electrode is performed after removing the portion of the nitride layer.

Item 18. The process of Item 17, further including removing a portion of the insulating layer.

Item 19. The process of Item 18, wherein removing the portion of the nitride layer is performed after removing the portion of the insulating layer and includes isotropically etching the nitride layer.

Item 20. The process of Item 18, wherein removing the portion of the insulating layer defines a sidewall and forming the gate electrode includes forming a conductive layer over the first and second dielectric layers and the insulating layer and anisotropically etching the conductive layer to form the gate electrode adjacent to the sidewall of the insulating layer.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A process of forming an electronic device comprising:
   forming a stepped gate dielectric layer, wherein the stepped gate dielectric layer has a first portion with a first thickness and a second portion with a second thickness, and wherein the first thickness is different than the second thickness;
   forming a nitride layer over the first dielectric layer;
   forming an insulating layer over the nitride layer;
   removing a portion of the nitride layer under the insulating layer; and
   forming a gate electrode of a transistor over the stepped gate dielectric layer, wherein a first portion of the gate electrode is disposed over the first portion of the stepped gate dielectric layer and a second portion of the gate electrode is disposed over the second portion of the stepped gate dielectric layer, and wherein forming the gate electrode is performed after removing the portion of the nitride layer.

2. The process of claim 1, further comprising removing a portion of the insulating layer.

3. The process of claim 2, wherein removing the portion of the nitride layer is performed after removing the portion of the insulating layer and comprises isotropically etching the nitride layer.

4. The process of claim 2, wherein:
removing the portion of the insulating layer defines a sidewall; and
forming the gate electrode comprises:
  forming a conductive layer over the first and second dielectric layers and the insulating layer; and
  anisotropically etching the conductive layer to form the gate electrode adjacent to the sidewall of the insulating layer.

5. A process of forming an electronic device comprising:
forming a first dielectric layer adjacent to a semiconductor layer, the first dielectric layer having a first thickness;
forming a drain region of a transistor after forming the first dielectric layer;
forming a second dielectric layer after forming the drain region, the second dielectric layer having a second thickness different than the first thickness;
forming a gate electrode of the transistor, wherein, from a top view, the gate electrode is disposed over the first and second dielectric layers;
forming an insulating layer over the gate electrode;
patterning the insulating layer to define a contact opening over the gate electrode; and
forming a conductive plug within the contact opening, wherein the conductive plug is electrically connected to the gate electrode, and wherein the conductive plug is disposed over the first and second dielectric layers.

6. The process of claim 5, further comprising removing a portion of the first dielectric layer, wherein forming the second dielectric layer is formed such that the second dielectric layer is disposed at a location from which the portion of the first dielectric layer was removed.

7. The process of claim 5, wherein the gate electrode abuts both the first and second dielectric layers.

8. The process of claim 5, further comprising forming a source region of the transistor, wherein:
the first thickness is greater than the second thickness.

9. The process of claim 8, further comprising:
providing a buried conductive region and the semiconductor layer having a primary surface and an opposing surface, wherein the buried conductive region is disposed closer to the opposing surface than to the primary surface; and
forming a vertical conductive region adjacent to the primary surface and extending through the semiconductor layer toward the buried conductive region,
wherein in a finished electronic device, the first vertical conductive region is electrically connected to the buried conductive region and the drain region of the transistor.

10. The process of claim 5, further comprising:
forming a nitride layer over the first dielectric layer;
forming an insulating layer over the nitride layer; and
removing a portion of the nitride layer under the insulating layer, wherein forming the gate electrode is performed after removing the portion of the nitride layer.

11. The process of claim 10, further comprising removing a portion of the insulating layer.

12. The process of claim 11, wherein removing the portion of the nitride layer is performed after removing the portion of the insulating layer and comprises isotropically etching the nitride layer.

13. The process of claim 11, wherein:
removing the portion of the insulating layer defines a sidewall; and
forming the gate electrode comprises: forming a conductive layer over the first and second dielectric layers and the insulating layer; and anisotropically etching the conductive layer to form the gate electrode adjacent to the sidewall of the insulating layer.

* * * * *